(12) United States Patent
Kunst et al.

(10) Patent No.: US 8,842,482 B1
(45) Date of Patent: Sep. 23, 2014

(54) PROGRAMMABLE MEMORY WITH SKEWED REPLICA AND REDUNDANT BITS FOR RESET CONTROL

(75) Inventors: David Kunst, Cupertino, CA (US); Hans Van Antwerpen, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 211 days.

(21) Appl. No.: 13/538,291

(22) Filed: Jun. 29, 2012

(51) Int. Cl.
*G11C 7/06* (2006.01)
*G11C 11/34* (2006.01)
*G11C 16/04* (2006.01)

(52) U.S. Cl.
USPC ............ 365/189.07; 365/185.04; 365/185.05; 365/185.2; 365/185.21

(58) Field of Classification Search
CPC .... G11C 14/00; G11C 16/0441; G11C 16/10; G11C 29/789; G11C 17/16; G11C 16/20; G11C 29/28; G11C 2029/0407; G11C 17/18; G11C 29/785; G11C 8/12; G06F 11/1004; G06F 1/3203; G06F 9/3877; G06F 21/73; G06F 11/006; G06F 12/1466; H01L 23/5256
USPC ............... 365/185.07, 185.04, 185.05, 185.2, 365/185.21, 93, 96, 201; 711/103, 163; 714/200
See application file for complete search history.

(56) References Cited

U.S. PATENT DOCUMENTS

| | | | |
|---|---|---|---|
| 5,467,396 A * | 11/1995 | Schossow et al. ............ 713/193 |
| 5,734,274 A * | 3/1998 | Gavish ............................ 327/48 |
| 6,258,700 B1 * | 7/2001 | Bohr et al. ..................... 438/467 |
| 6,766,449 B2 * | 7/2004 | Espinosa et al. .............. 713/100 |
| 6,874,083 B2 * | 3/2005 | Sarangi et al. ................ 713/100 |
| 6,888,751 B2 | 5/2005 | Makuta et al. |
| 7,345,903 B2 | 3/2008 | Nakano et al. |
| 7,486,537 B2 | 2/2009 | Scheuerlein et al. |
| 7,551,488 B2 | 6/2009 | Tanikawa et al. |
| 7,724,022 B1 | 5/2010 | Deskin et al. |
| 7,821,836 B2 | 10/2010 | Kim et al. |
| 7,957,208 B1 | 6/2011 | Tang et al. |
| 8,004,904 B2 | 8/2011 | Momii |
| 8,054,125 B2 | 11/2011 | Nervegna |

OTHER PUBLICATIONS

Texas Instruments, KeyStone Architecture SOC Security User Guide, Oct. 2011, Dallas, Texas U.S.A.

* cited by examiner

*Primary Examiner* — Richard Elms
*Assistant Examiner* — Ajay Ojha

(57) ABSTRACT

Embodiments of a circuit and method for setting initial trim bits in an integrated circuit (IC) are described. The circuit includes a memory array including a plurality of trim bit cells to store and provide trim bits to trim registers in a main circuit of the IC following energizing of the IC. The memory array further includes replica bit circuitry to generate a number of replica bits. A logic circuit coupled to the memory array and the main circuit of the IC is configured to receive the replica bits, and to provide a signal to the IC that indicates when the trim bits are valid. In one embodiment, the circuit further includes redundancy check logic configured to receive a number of the trim bits from the memory array, compare the number of trim bits to a pre-determined or computed value, and to provide a BITS_OK signal to the logic circuit.

17 Claims, 16 Drawing Sheets

US 8,842,482 B1

PROGRAMMABLE MEMORY WITH SKEWED REPLICA AND REDUNDANT BITS FOR RESET CONTROL

TECHNICAL FIELD

The present disclosure relates generally to integrated circuits (IC), and more particularly, to a circuit and method for setting initial trim bits in the IC.

BACKGROUND

Following energizing or re-energizing of an integrated circuit (IC), such as a memory device, microcontroller or processor, system-on-chip (SoC) or programmable SoC (PSoC), trim information for operating references, regulators, clocks, etcetera, is copied from a non-volatile memory to volatile latches or trim registers in a main circuit of the IC. The majority of trim information is copied in software to relevant trim registers as part of a boot process. A small portion of the trim information, however, is required to be valid prior to the boot process to ensure that the IC has usable power supplies, reference and regulator voltages, clocks, and the correct state(s) on certain input/output pins before the IC transitions out of its power-on reset state and begins the boot process. This initial trim information is programmed only once during manufacturing.

One problem with conventional circuits and methods for setting initial trim bits in the IC is that differences between the non-volatile memory and main circuit of the IC, such as variations in process, voltage, and temperature (PVT) corners of devices, can result in recalling or transferring trim bits to the trim registers in the IC before a power supply voltage (VDD) has risen sufficiently high to ensure the trim bits are valid. Prior approaches to addressing this problem have used a separate power supply supervisor circuit, which asserts a power good signal to trigger transferring of trim bits after VDD is above a pre-determined threshold. This approach has not been wholly satisfactory as the addition of a separate power supply supervisor circuit adds to the cost, complexity, standby current, and size of the IC. Moreover, the approach has not been entirely effective because of interdependencies resulting from uncorrelated PVT variations in the non-volatile memory, trim registers and power supply supervisor circuit result in difficult design challenges, which often require multiple rework cycles to ensure proper operation.

BRIEF DESCRIPTION OF THE DRAWINGS

The present invention will be understood more fully from the detailed description that follows and from the accompanying drawings and the appended claims provided below, where:

DETAILED DESCRIPTION

Figure 1:
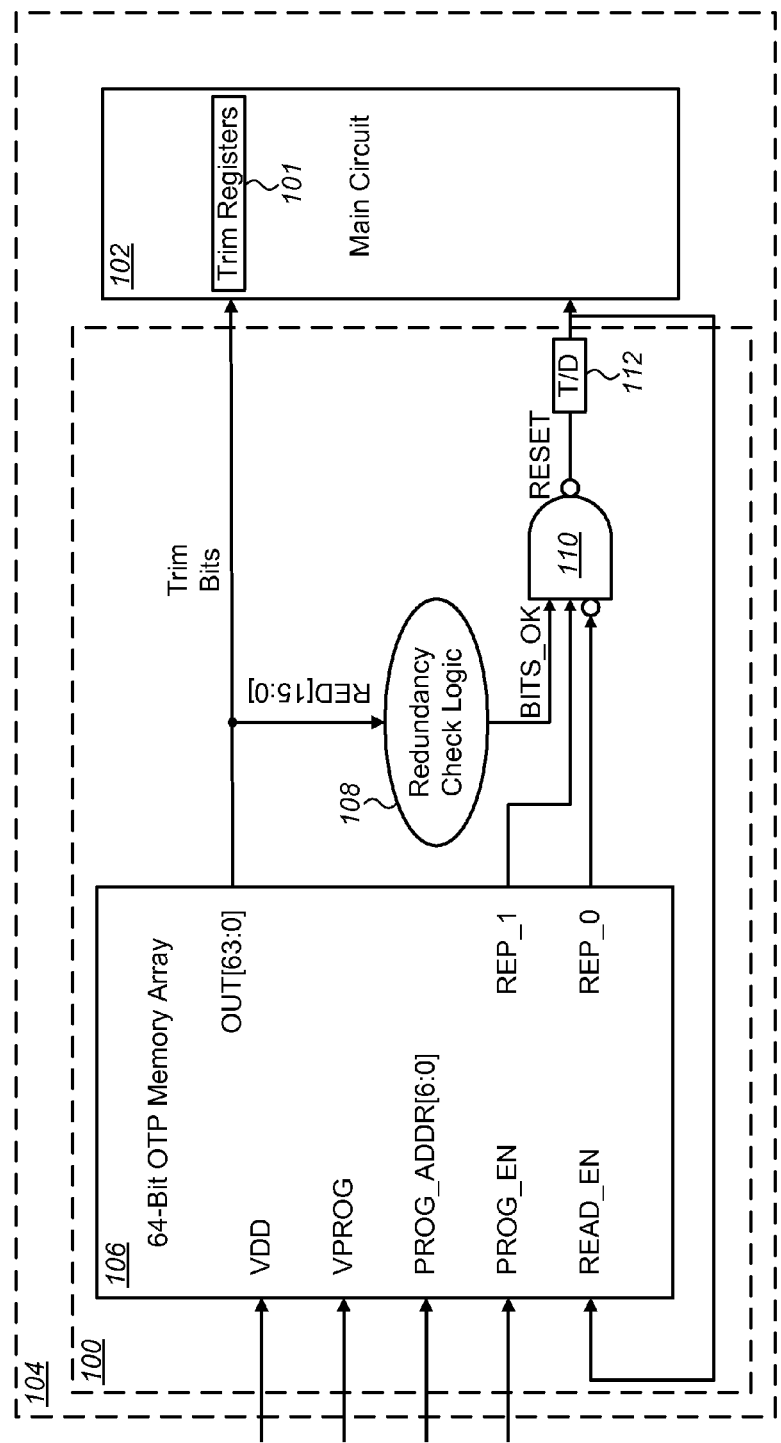
FIG. 1 is a block diagram of an embodiment of a circuit including redundancy check logic and skewed replica bits to provide initial trim bits to a main circuit of an integrated circuit (IC)

FIG. 1 illustrates an embodiment of an initial trim circuit 100 including redundancy check logic and replica bits to provide initial trim bits to trim registers 101 in a main circuit 102 of an integrated circuit (IC 104). The IC 104 can include in addition to the initial trim circuit 100 a semiconductor memory, microprocessor, microcontrollers or a system-on-chip, such as a Programmable-System-on-Chip (PSoC™) commercially available from Cypress Semiconductor of San Jose, Calif. The initial trim circuit 100 is integrally formed on the IC 104 with the main circuit 102 to which the initial trim bits are provided, as in the embodiment shown.

Referring to FIG. 1, the initial trim circuit 100 includes a memory array 106 having a plurality of trim bit cells to store and provide trim bits to the main circuit 102 of the IC 104 coupled thereto following energizing or re-energizing the IC, and circuitry to generate a number of skewed replica bits (REP_0 and REP_1). By skewed it is meant a reference current used to generate the replica bits is decreased or increased compared to that used to provide a normal trim bit, to effectively increase the minimum supply voltage ($VDD_{MIN}$) needed to output or resolve replica bits as compared to the normal trim bits.

The initial trim circuit 100 further includes redundancy check logic 108 coupled to the memory array 106 and a logic circuit 110 coupled to the memory array, redundancy check logic and the main circuit 102 of the IC 104. The redundancy check logic 108 is configured to receive a certain number of the trim bits (i.e., redundant bits, which have been programmed to pre-determined values) from the memory array 106, compare the redundant bits to the pre-determined values, and generate a BITS_OK signal. The logic circuit 110 is configured to receive the number of replica bits and the BIT- S_OK signal, and to provide a RESET signal to the IC 104 that indicates when the trim bits are valid (e.g., RESET is asserted and the IC remains in a reset state when the trim bits are not valid, and RESET is de-asserted and the IC transitions out of its reset state when the trim bits are valid).

In some embodiments, such as that shown, the RESET signal may also act as a power-on-reset (POR), which may be used to turn off all or part of the initial trim circuit 100 and initiate a boot process in the IC 104. By turn off it is meant to put the initial trim circuit 100 into a standby mode with substantially zero power supply current. Since the replica and redundant bits are constructed in the memory array 106 with the same circuit and devices as the trim bits, and since a separate power supply supervisor circuit is not needed, the circuit interdependencies that plagued previous initial trim circuits are eliminated.

In the embodiment shown in FIG. 1 the memory array 106 used to store initial trim information is a 64-bit one-time-programmable (OTP) memory array. The trim information is output as trim bits, which are used by IC 104 to set certain critical parameters, such as the system reference voltages, on-chip regulator output voltages, system clocks, and the power-up state of certain input/output (I/O) pins, which need to be established before the boot process begins.

The trim bits are programmed during manufacture of the IC 104 including the initial trim circuit 100, either during wafer-level test or final test after IC packaging. In the embodiment shown, the initial trim circuit 100 uses two replica bits, including a replica zero bit (REP_0) and a replica one bit (REP_1) and sixteen redundant bits (RED[15:0]) to determine when the trim bits in the OTP memory array 106 are valid and stable.

The replica bits, REP_1 and REP_0, are designed to produce logical output values of 1 and 0, respectively, when a supply voltage (VDD) to the IC 104 reaches a level that is high enough to enable the initial trim circuit 100 to resolve these bits, which are designed to resolve at a VDD voltage that is slightly higher than the VDD voltage required to resolve the normal trim bits. For example, the replica bits may need an additional 100 mV on VDD compared to the normal trim bits. The design of the circuitry to generate the replica bits is the substantially the same as the normal trim bit cells in the memory array used to store the initial trim information, except for certain devices in the replica bits which are slightly over-sized or under-sized, compared to the normal trim bits, such that the replica bits require a slightly higher VDD to resolve. This ensures that the normal trim bits are valid when the replica bits are valid, with respect to the minimum required voltage on VDD ($VDD_{MIN}$). Circuit design details of the normal trim bits and replica bits are described in greater detail below.

The 16 redundant bits are stored/generated in cells substantially the same as the trim bit cells and are substantially identical to the trim bits. They are programmed during factory test to a specific or computed pattern (or key) of 1's and 0's. In one embodiment of the present invention, the redundancy check logic 108 simply compares the redundant bit outputs with the pre-determined key and asserts a BITS_OK signal when all 16 redundant trim bits match the pre-determined key. The BITS_OK signal and the replica bit outputs are logically combined through the logic circuit 110, as shown in FIG. 1, to generate a RESET signal, which may be used to turn on/off the memory array 106, as well as act as a system-level power-on-reset (POR) signal for the IC 104 to initiate the boot process.

In some embodiments, such as that shown, the initial trim circuit 100 may further include a time delay or filter 112 at the output of the logic circuit 110, or in the redundancy check logic 108, in order to suppress momentary transient glitches or noise on VDD.

Figure 2:
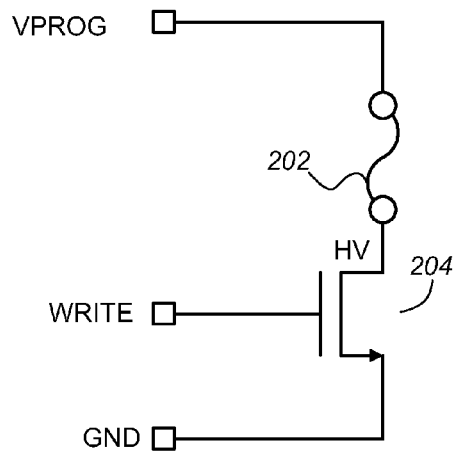
FIG. 2 is a schematic diagram illustrating an embodiment of a fuse blowing circuit used to store initial trim information in a memory array of an initial trim circuit.

In a particular embodiment, poly fuses are used to store initial trim bits in a one-time programmable (OTP) memory array 106, such as that shown in FIG. 1. The poly fuses are programmed during factory test using a fuse blowing circuit, such as that shown in FIG. 2. This fuse circuit is included in each trim bit cell, along with sense, latch and buffer circuitry.

Fuses are selectively blown during factory test by asserting the WRITE signal applied to the gate of the NFET driver for a period of time to allow sufficient fusing current to flow from the programming power supply (VPROG) through the poly fuse 202 to ground (GND). For example, in one embodiment VPROG is equal to 2.5V and an NFET driver 204 and poly fuse 202 are sized such that the fuse is sufficiently blown with a WRITE pulse width of 1 us and fuse current of approximately 12 mA. In one embodiment, the maximum resistance of the unblown fuse is 200Ω, and the minimum resistance of a blown fuse is 10 kΩ. The fuse resistance is denoted $R_{FUSE}$. The write logic, which is contained in a read/write control circuit of the OTP memory array 106, includes an address decoder that selects one bit at a time for fuse blowing.

Figure 3:
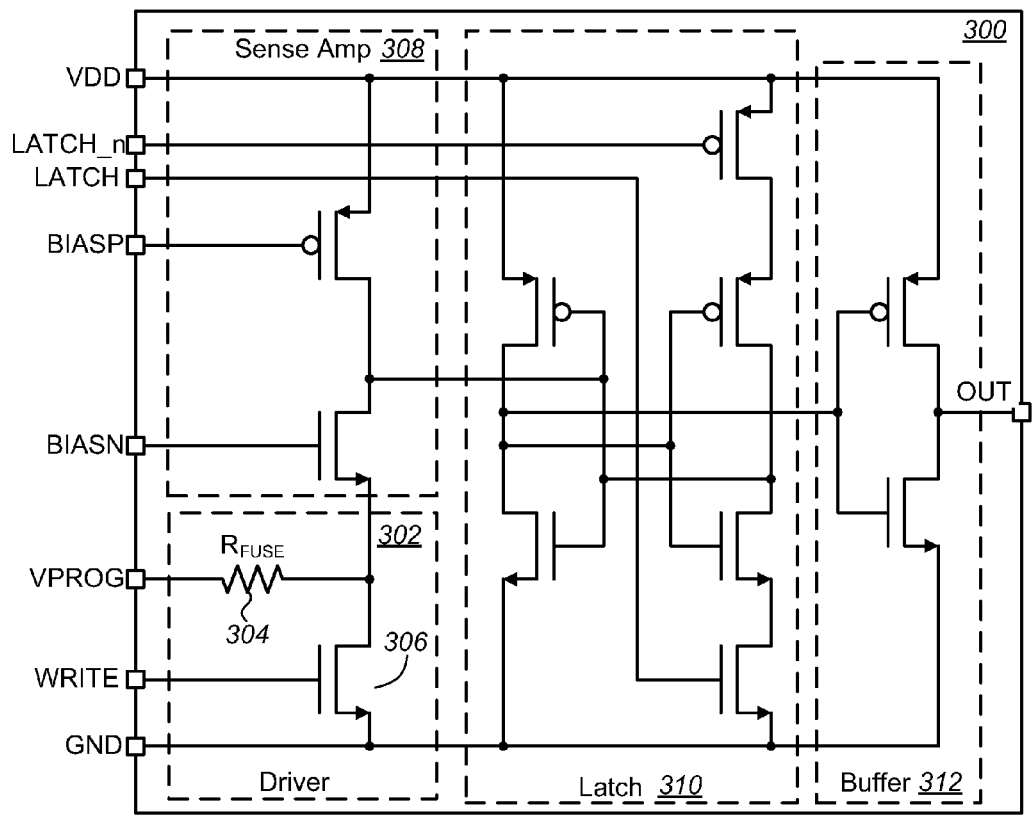
FIG. 3 is a schematic diagram illustrating an embodiment of a trim bit cell in a memory array.

An embodiment of a fuse blowing circuit incorporated in an eFuse trim bit cell is shown in FIG. 3. Referring to FIG. 3, each trim bit cell 300 contains a fuse blowing circuit or driver 302 including a poly fuse ($R_{FUSE}$ 304) and fuse blowing NFET driver 306, a sense amp 308, a latch 310 and an output buffer 312. The logic control signals, WRITE, LATCH, and LATCH_n are provided by a read/write control logic circuit (not shown in FIG. 3), and the sense amp bias signals, BIASP and BIASN, are provided by a read bias generator circuit, which will be described in further detail below.

In normal operation (i.e., after the OTP memory array has been programmed), VPROG is grounded, the WRITE signal is de-asserted, and the trim bit circuit has two modes of operation, ON and OFF, as determined by the memory array's READ_EN signal (see FIG. 1). During power up, when READ_EN is asserted, all trim bit circuits are on, the sense amps 308 are active, and output latches 310 are off (LATCH signal de-asserted). When the trim bits are valid, READ_EN is de-asserted, all trim bit circuits are off; i.e., sense amps 308 are off (drawing substantially zero quiescent current), and latches 310 are on, retaining the logical state of the eFuse 304 (e.g., high for bits with blown fuses and low for bits with unblown fuses).

In normal operation, during power up, the sense amps 308 are enabled and LATCH inputs are de-asserted. When the VDD voltage level is sufficient enough to resolve all trim bits, as determined by the replica and redundant bits (see FIG. 1), the control circuit of the OTP memory array (not shown in FIG. 3) asserts the LATCH signal and turns off the trim bit sense amps 308 by driving BIASP to VDD and BIASN to GND. The steady-state quiescent current of the entire eFuse array becomes substantially zero, and the trim information is retained in the trim bit latches 310.

In certain embodiments, all trim bits are read and latched simultaneously. The control circuit of the OTP memory array includes a read bias generator that provides the bias signals, BIASP and BIASN, which are used by the sense amps 308 inside the trim bit cells 300 to determine whether or not a fuse 304 has been blown. The sense amps 308 essentially compare the resistance of the fuse 304 to a reference resistance, as shown in the simplified trim bit cell circuit diagrams FIGS. 4A-C, where the fuse and reference resistances have been transformed into currents that are compared by a sense amp, which acts as a current comparator.

Figure 4A:
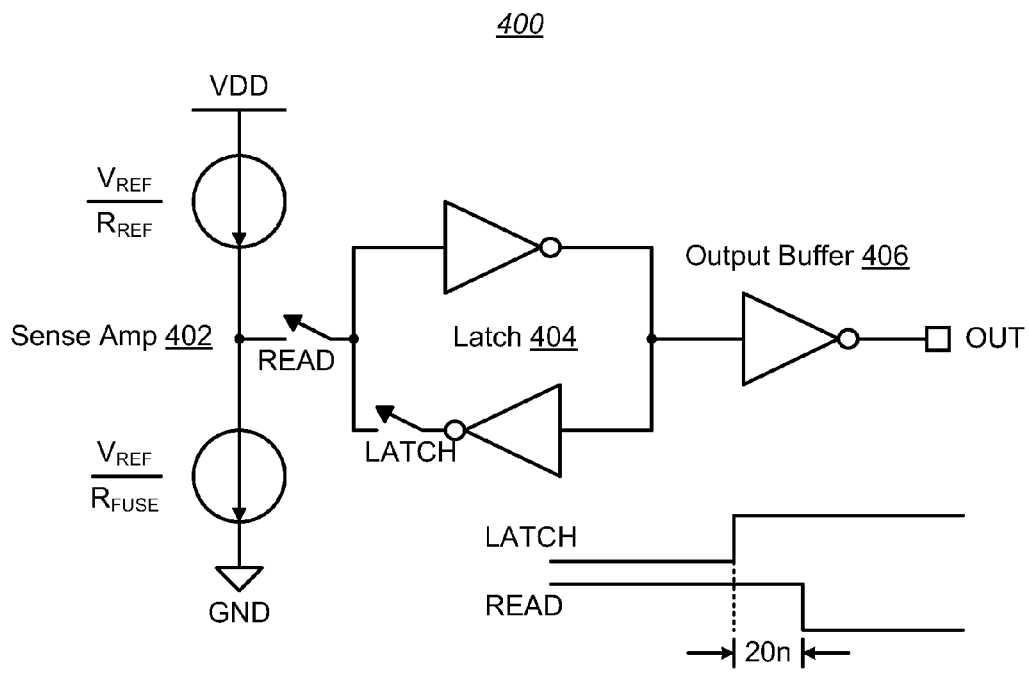
FIGS. 4A to 4C are simplified schematics of the trim bit cell of FIG. 3.

Referring to the simplified circuit diagram of FIG. 4A, the trim bit cell 400 includes a current comparator or sense amp 402, a latch 404 and an output buffer 406.

Figure 4B:
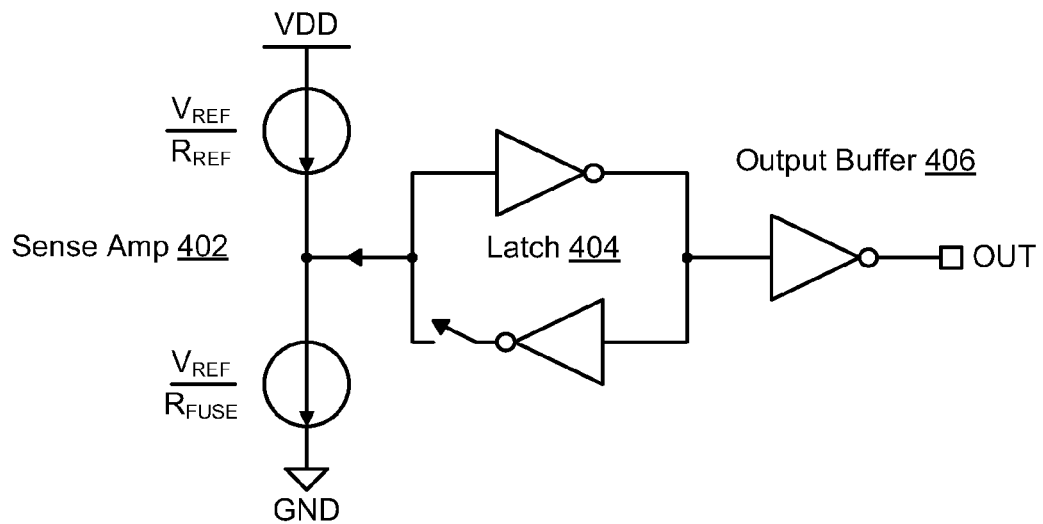
Figure 4C:
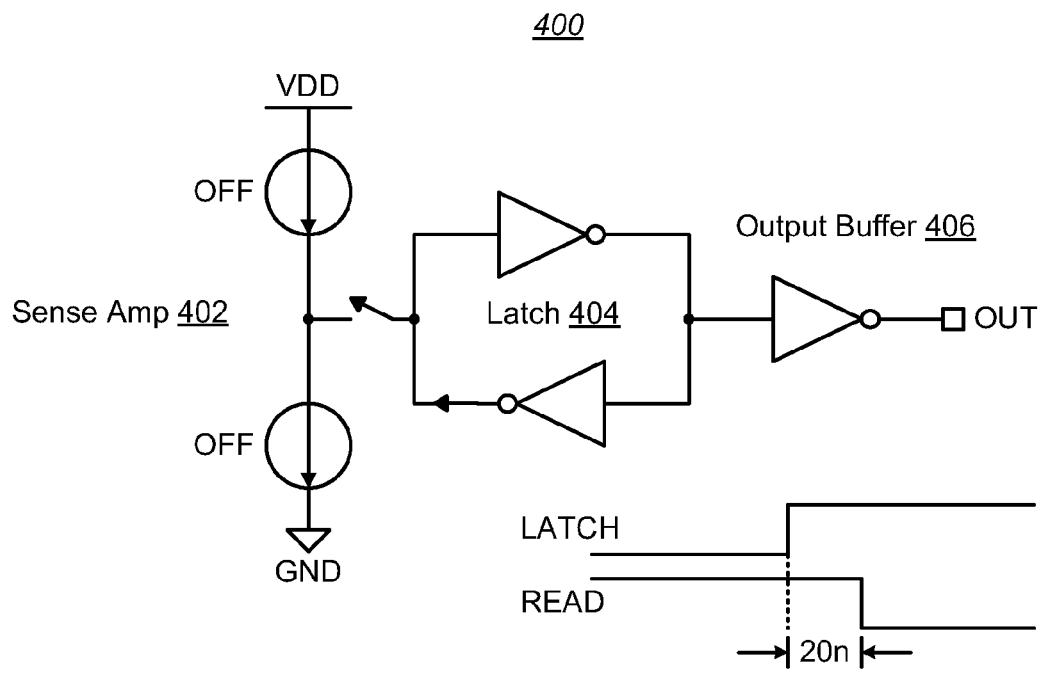

FIGS. 4B and 4C illustrate configuration of the simplified circuit diagram of FIG. 4A during read and latch mode, respectively. Referring to FIG. 4B, in read mode, the sense amp 402 is enabled, and the fuse resistance ($R_{FUSE}$) is compared to a reference resistance ($R_{REF}$), where $R_{FUSE} > R_{REF}$ for blown fuses and $R_{FUSE} < R_{REF}$ for unblown fuses. In a particular embodiment, for example, the minimum resistance of a blown fuse is 10 kΩ and the maximum resistance of an unblown fuse is 200Ω. In this case, the nominal reference resistance is 4.9 kΩ which, in one embodiment, is nominally centered between the minimum blown fuse resistance and maximum unblown fuse resistance.

Referring to FIG. 4C, in latch mode READ_EN is de-asserted, BIASP and BIASN are pulled to their respective power supply rails to cut off the power supply current in the sense amp. Note that the read/write control logic in the OTP memory array delays the de-assertion of the READ signal with respect to the LATCH signal to ensure that the state of the fuse is latched before the sense amp 402 bias is turned off. FIG. 4C further includes a simplified timing diagram of READ and LATCH signals provided to the trim bit cell 400 by read/write control logic in the OTP memory array. As shown in the timing diagram in one embodiment the delay is about 20 ns.

Figure 5:
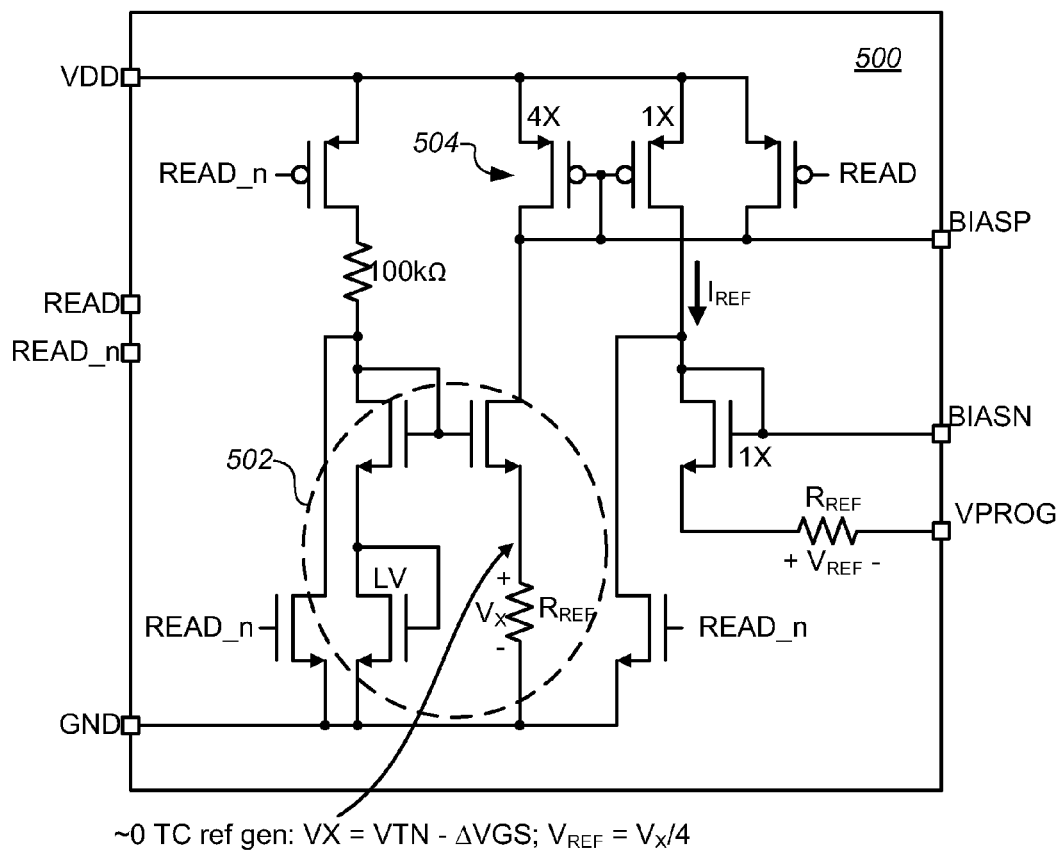
FIG. 5 is a schematic diagram illustrating an embodiment of a read bias generator in a control circuit of a memory array.

As noted above, the control circuit of the OTP memory array includes a read bias generator, which provides the BIASP and BIASN control signals to the trim bit cells. An exemplary embodiment of a read bias generator 500 is depicted in FIG. 5. Referring to FIG. 5, a voltage to current converter 502 in the read bias generator 500 translates a reference resistance ($R_{REF}$) to a reference current ($I_{REF} \approx V_{REF}/R_{REF}$). A near zero temperature coefficient (TC) reference voltage $V_{REF}$ is created ($V_{REF} \approx V_X/4$ and $V_X = V_{TN} + \Delta V_{GS}$) and used to generate bias currents, which are mirrored into sense amps in the trim bit cells via BIASP and BIASN, and compared to a fuse current ($I_{FUSE} \approx V_{REF}/R_{FUSE}$) to determine if the fuse in the trim bit cell has been blown. A 4:1 attenuation in the current mirror(s) 504, formed by the 4× diode-connected PFET and the 1× mirror devices in read bias generator and trim bit cells, reduces the total supply current in the eFuse memory array during read.

Figure 6:
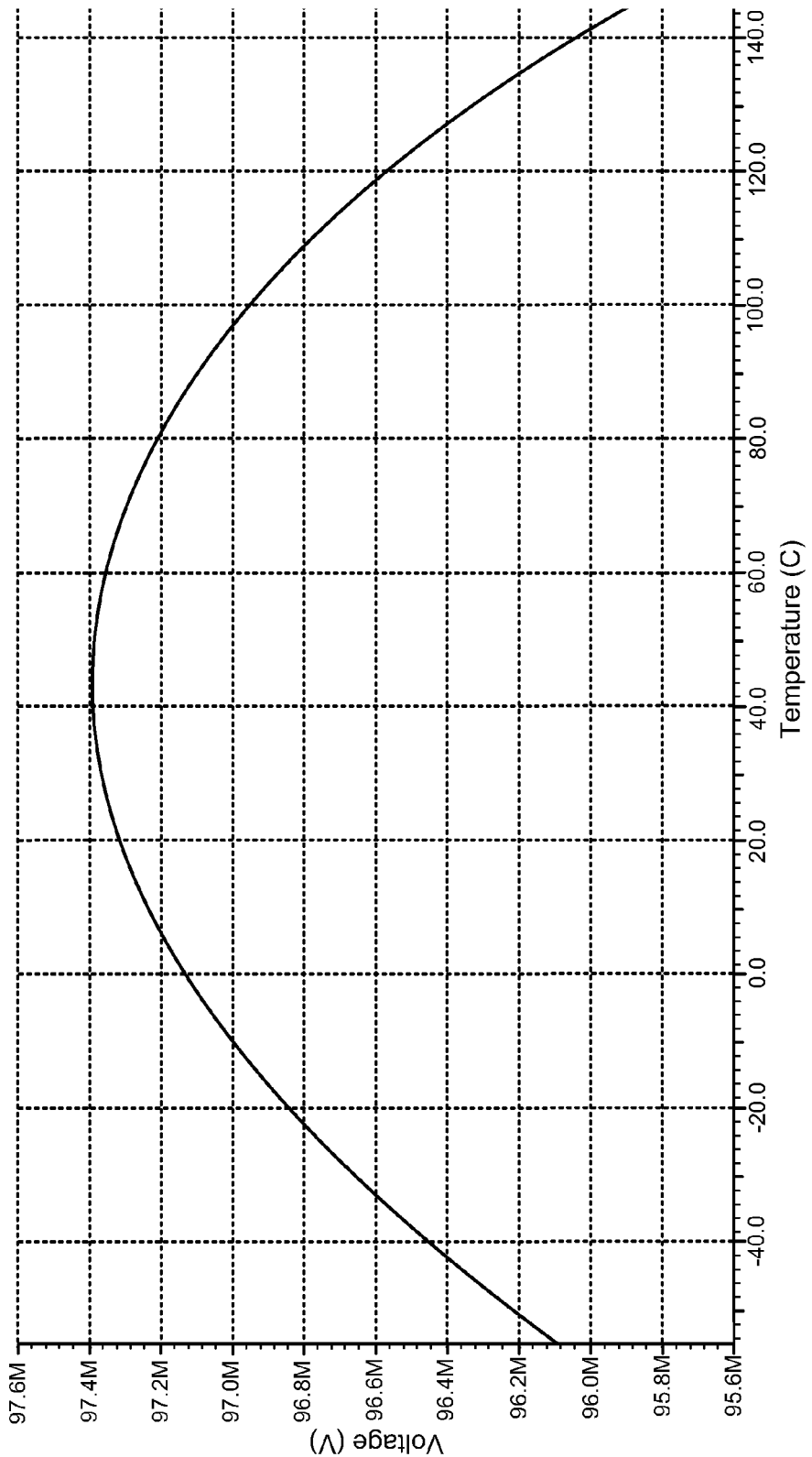
FIG. 6 is a plot of a reference setting voltage ($V_X$) in a read bias generator versus temperature at a supply voltage (VDD) of 1V.

FIG. 6 provides a plot of an exemplary reference setting voltage ($V_X$ in FIG. 5) vs. temperature at VDD=1V. Note that $V_{REF} = V_X/4$, where $V_{REF}$ is the voltage across $R_{REF}$ in FIG. 5.

Figure 7:
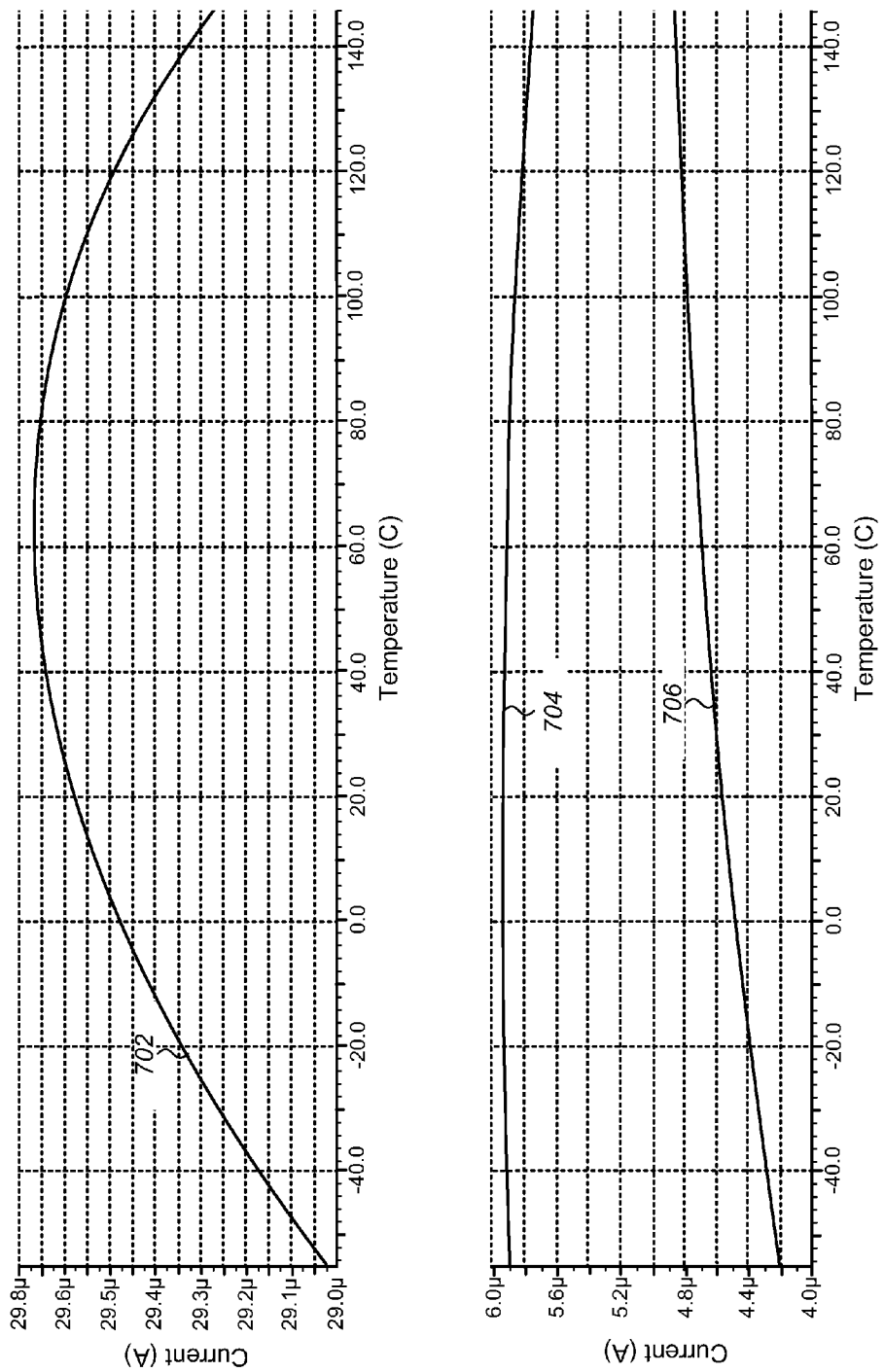
FIG. 7 illustrates plots of read bias current and normal bit currents versus temperature.

FIG. 7 provide plots of exemplary read bias current 702 (before the 4:1 current mirror attenuation) and trim bit currents vs. temperature. In the plots line 704 represents a current for a trim bit that has been programmed to logic 0 ($R_{FUSE}=200\Omega$), and line 706 represents a current for a trim bit that has been programmed to logic 1 ($R_{FUSE}=10$ kΩ).

Figure 8:
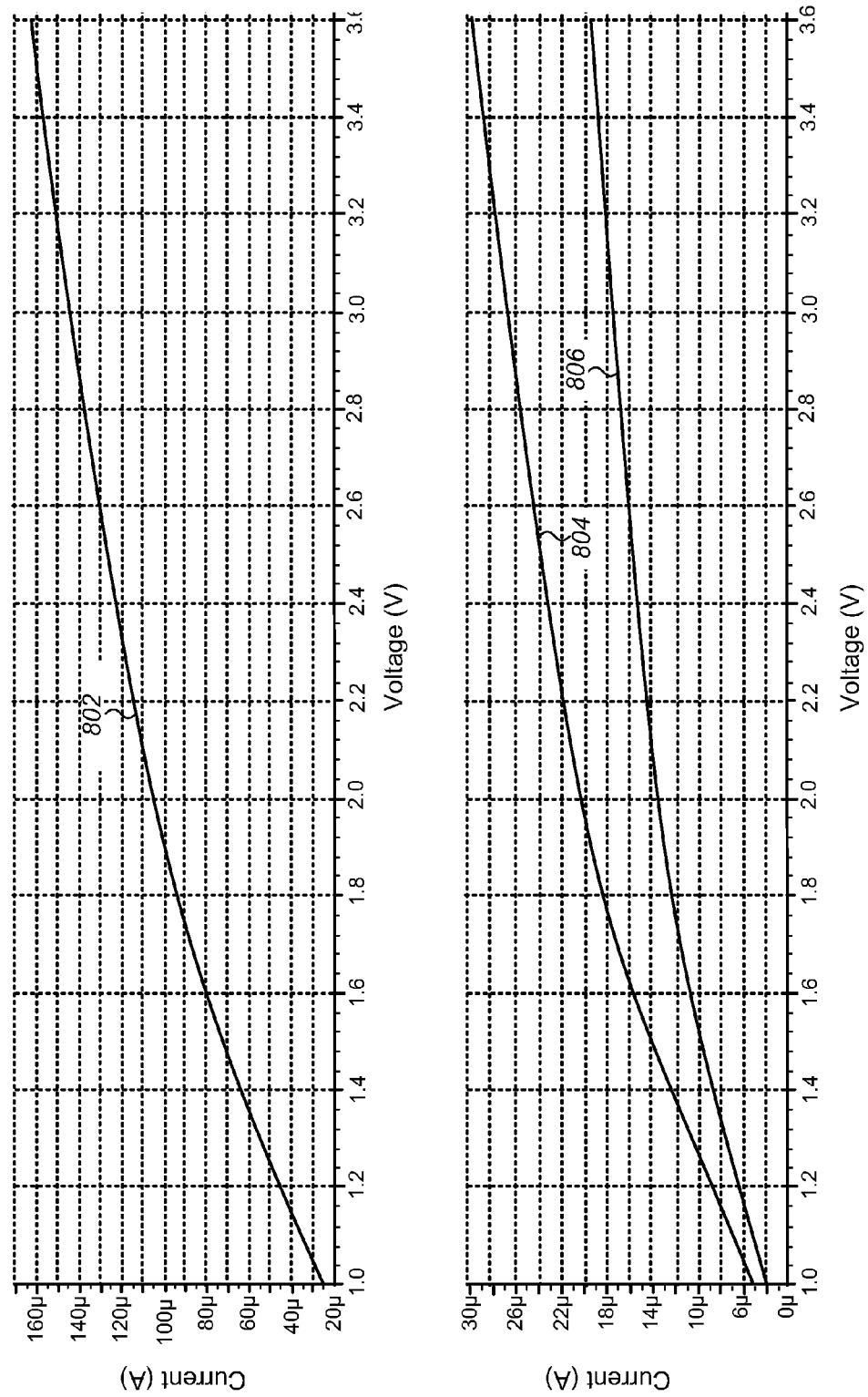
FIG. 8 illustrates plots of read bias current and normal bit currents versus supply voltage (VDD)

FIG. 8 provide plots of exemplary read bias current 802 (before the 4:1 current mirror attenuation) and trim bit currents vs. supply voltage (VDD). In the plots line 804 represents a current for a trim bit that has been programmed to logic 0 ($R_{FUSE}=200\Omega$), and line 806 represents a current for a trim bit that has been programmed to logic 1 ($R_{FUSE}=10$ kΩ).

Figure 9:
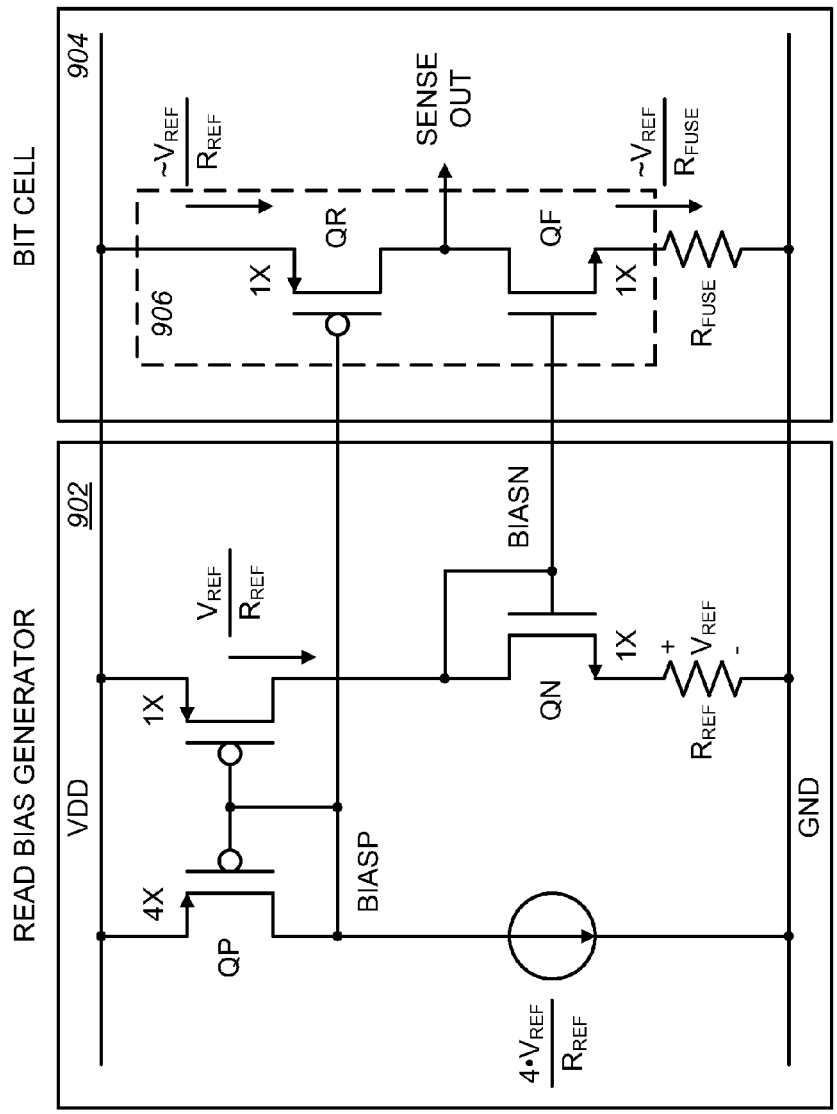
FIG. 9 is a schematic diagram illustrating a resistance comparator formed between a read bias generator and a trim bit cell in a memory array.

FIG. 9 is a simplified schematic diagram of a read bias generator 902 and an eFuse trim bit cell 904 in an eFuse memory array. FIG. 9 illustrates current mirrors formed between diode connected devices in the bias generator 902, designated as QP and QN, and current mirror devices, QR and QF, in the trim bit cell 904. The output voltage of a resistance comparator or sense amp 906 in the trim bit cell 904 is low for unblown fuses, since $R_{FUSE} < R_{REF}$, and high for blown fuses, since $R_{FUSE} > R_{REF}$.

Figure 10A:
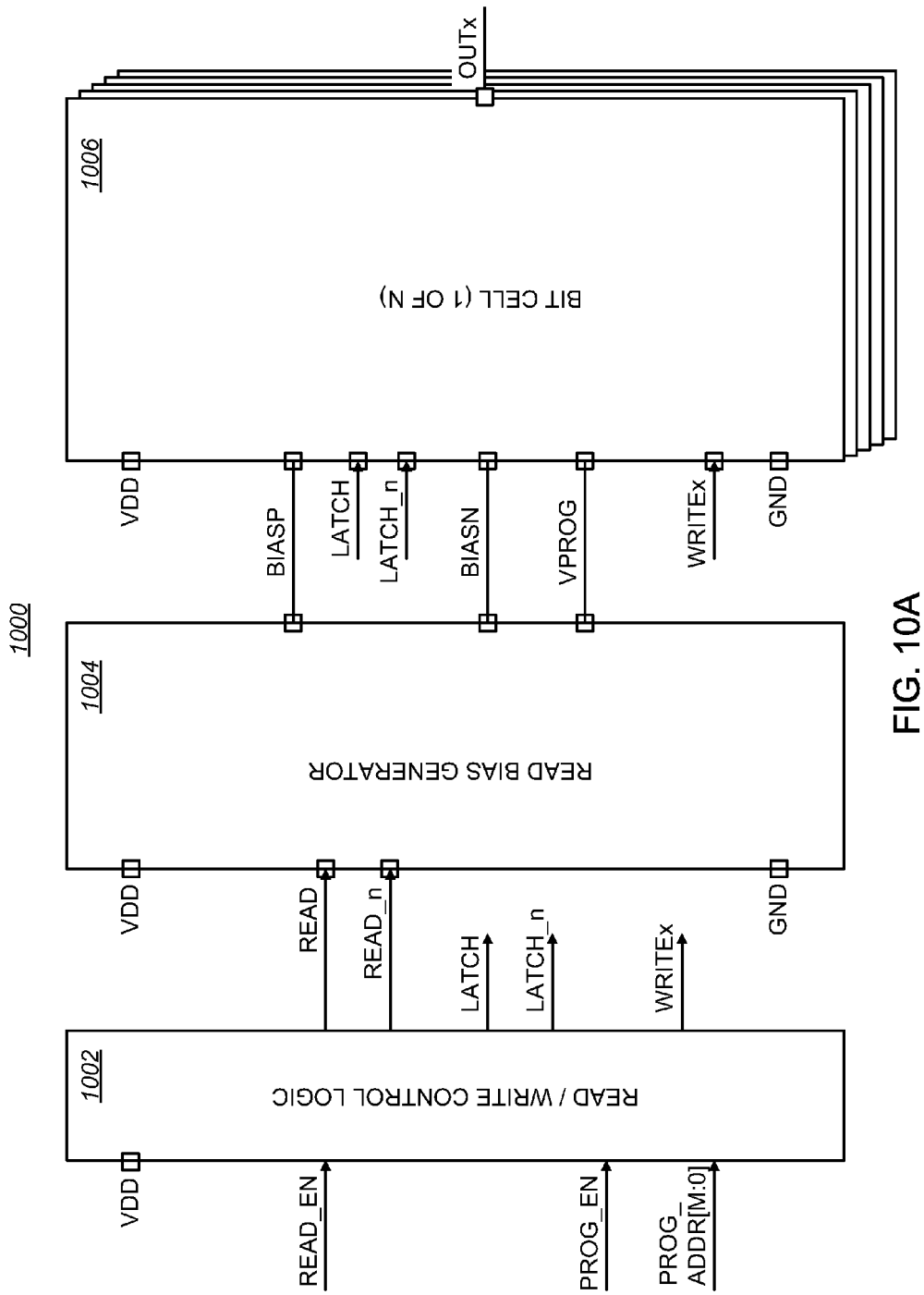
FIG. 10A is a block diagram of an embodiment of a memory array, including read/write control logic and a read bias generator to drive a number (N) of trim bit cells.
Figure 10B:
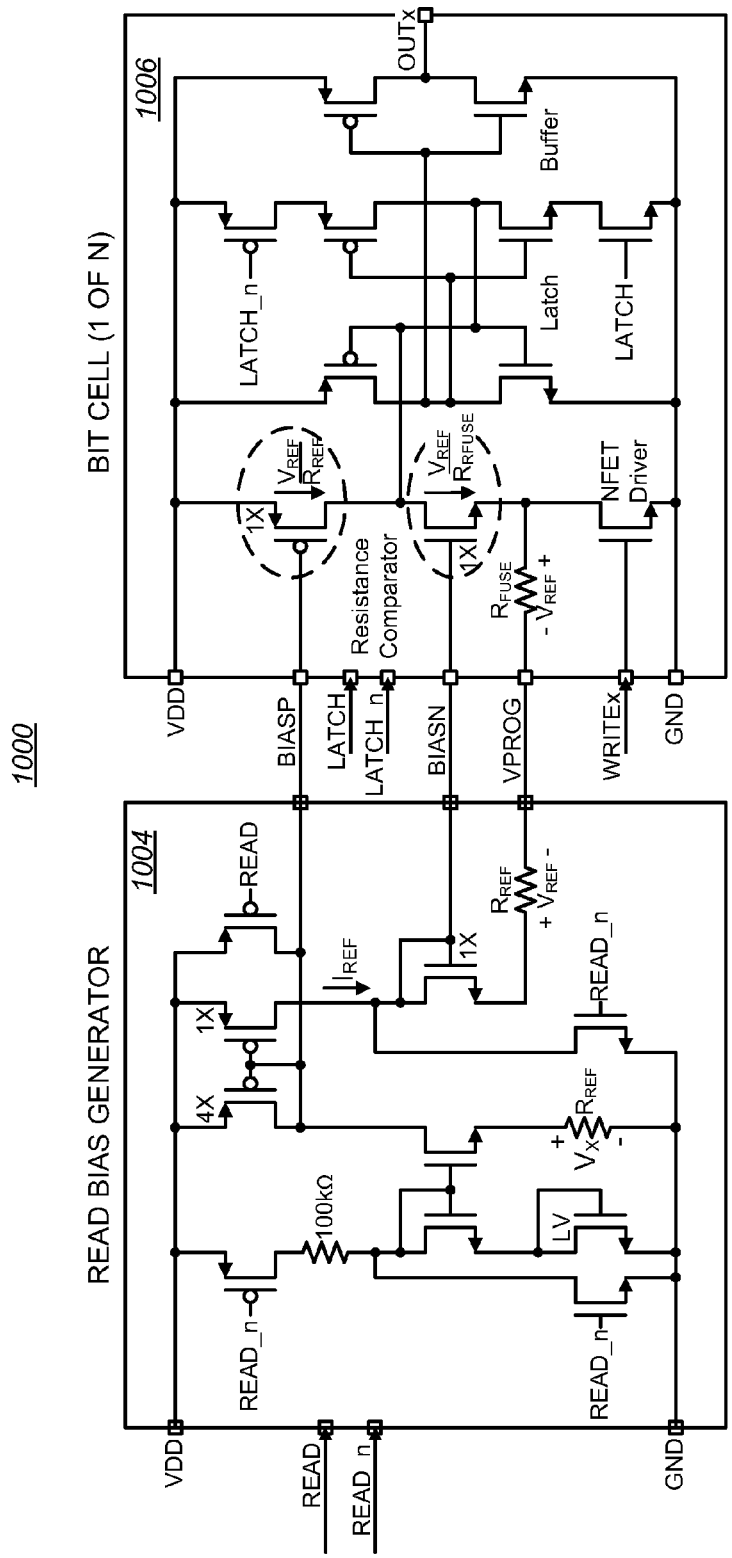
FIG. 10B is a schematic diagram illustrating an embodiment of the read bias generator and a trim bit cell of the memory array of FIG. 10A.

FIGS. 10A and 10B provide the schematics of a scalable eFuse memory array 1000, which utilizes one control circuit (comprising read/write control logic 1002 and a read bias generator 1004) to drive N trim bit cells 1006. The read/write control logic 1002 includes a write address decoder, which asserts the trim bits' WRITE signal (one bit at a time in one embodiment) for blowing fuses during factory test or programming, and generates properly timed READ and LATCH signals during normal operation in the end system, as shown in FIG. 4C, to ensure the fuse data is latched before the read bias is extinguished to provide substantially zero steady-state supply current for the memory array 1000, after power up. In one embodiment, a programming voltage ($V_{PROG}$) is 2.5V for programming in test mode, and 0V for normal operation.

As noted above, the redundant bits, which are used to determine when the trim bits are valid, are identical in design to the trim bits, and in one embodiment are programmed to a predetermined key or value during factory test or programming. The circuitry for generating the skewed replica bits however, is slightly modified, compared to the normal trim bits, so that the minimum VDD required to resolve the replica bits is slightly higher than the VDD required to resolve the normal trim bits. This can be accomplished, for example, by modifying the BIASP and BIASN current mirror devices in the replica bits as shown in the simplified circuit diagrams of FIGS. 11A and 11B. Similar to the simplified trim bit cell circuit diagrams of FIGS. 4A-C, the circuitry for generating the skewed replica bits 1100 includes a sense amp 1102, a latch 1104 and an output buffer 1106.

Figure 11A:
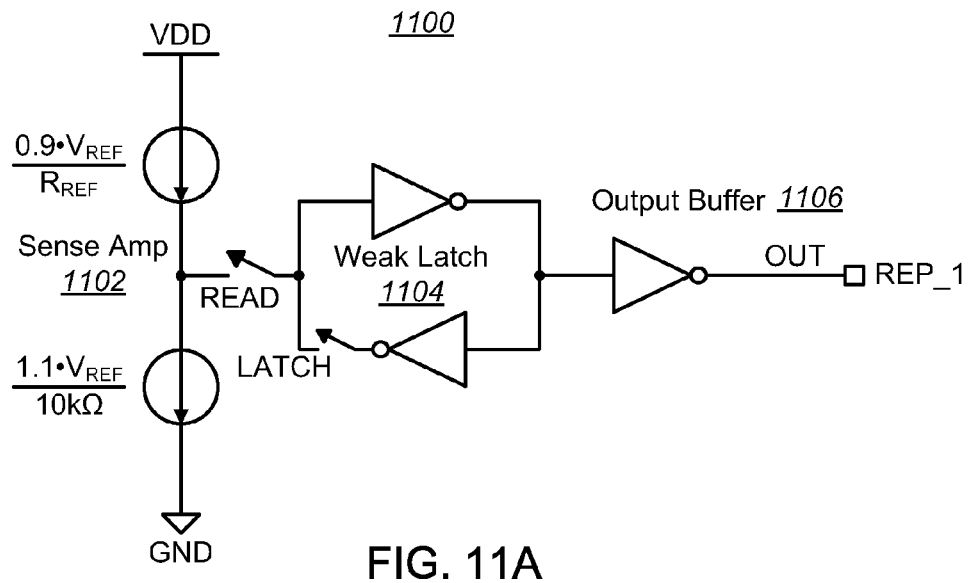
FIGS. 11A and 11B are simplified schematics of an embodiment of circuits for generating skewed replica bits in an initial trim circuit.

Referring to FIG. 11A, in one embodiment, the circuitry 1100 to generate a replica one bit (REP_1) has a fixed 10 kΩ resistor (i.e., nominally equal to the minimum specified blown fuse resistance) in place of the poly fuse of FIGS. 4A to 4C. The reference current, pulling up on the output of a sense amp 1102, is reduced by 10%, compared to a normal trim bit, and the current in the mimicked 10 kΩ blown fuse resistor, which pulls down on the sense amp output, is increased by 10%, compared to a normal trim bit. These skewed currents effectively increase the minimum supply voltage ($VDD_{MIN}$) needed to output a logic one, compared to the normal (blown fuse) trim bits.

Figure 11B:
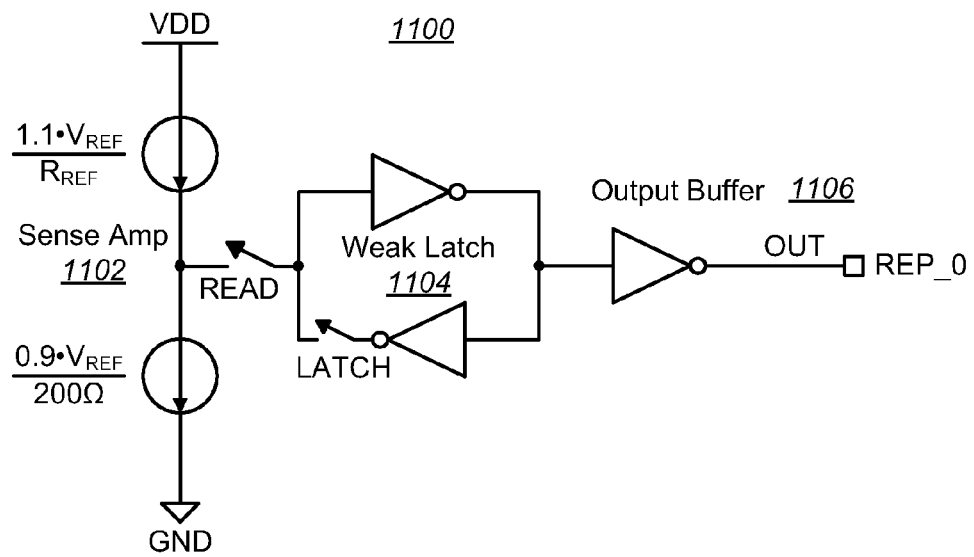

In FIG. 11B, the replica zero bit (REP_0) is skewed in the opposite direction; i.e., the reference (pull-up) current is increased by 10% and the fuse pull-down current decreased by 10%. In one embodiment, the fuse in the replica zero bit is an unblown fuse that is identical to the unblown fuse in the trim bits. Again, because of the skewed currents, the replica zero bit requires slightly higher VDD, compared to the normal trim bit cells, to resolve a logic zero. The +/−10% current mirror gain/attenuation can be realized by changing either a width (W) or length (L) of the current mirror devices in the replica bits to achieve the current mirror gain or attenuation needed to achieve the desired increase in VDD to resolve the replica bits. In the example circuits shown in FIGS. 11A and 11B, the current gain/attenuation ratios are 1.1 and 0.9, which can be realized by making the respective W/L ratio adjustments in the mirror device dimensions in the replica bits.

Figure 12:
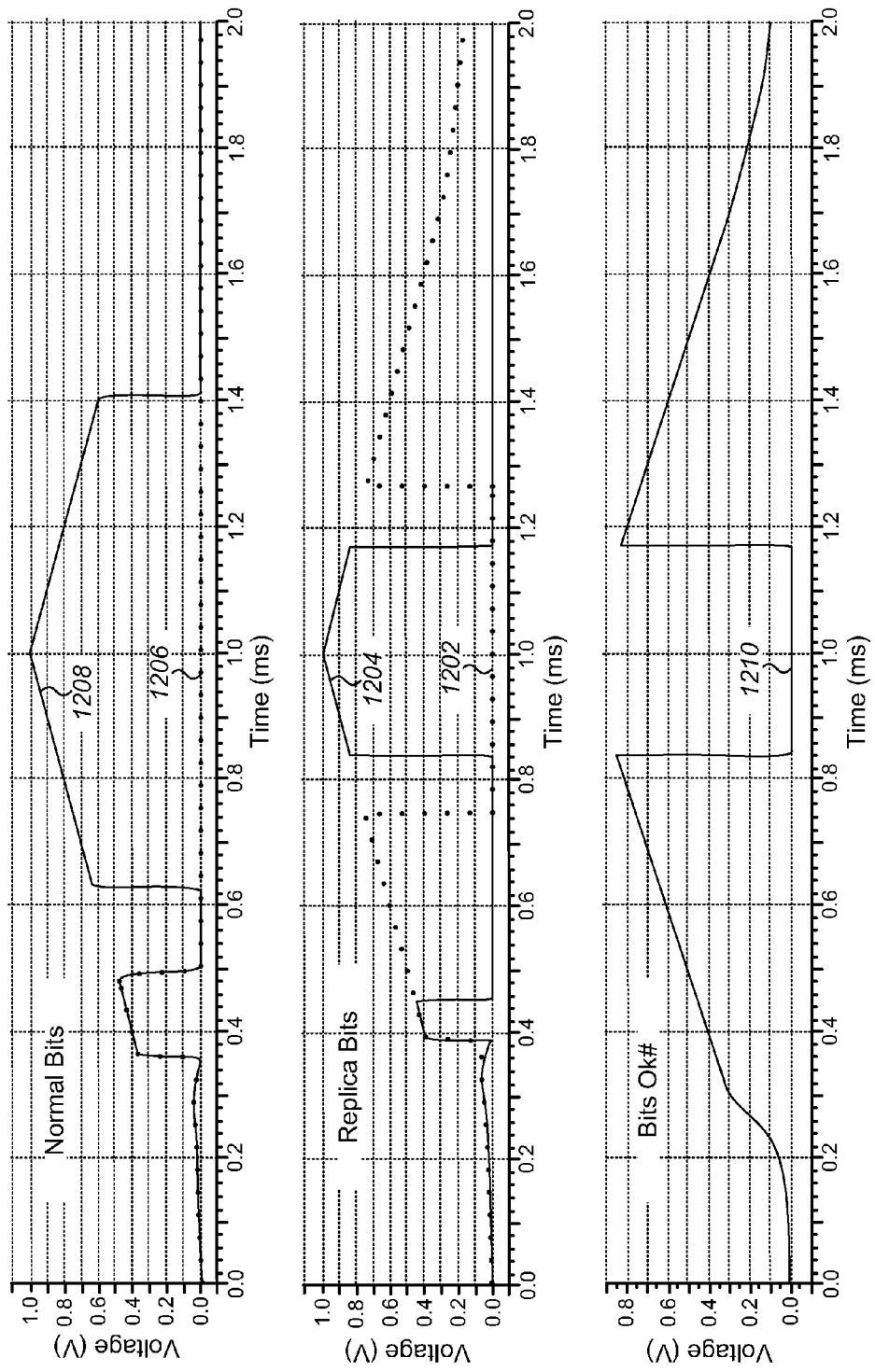
FIG. 12 illustrates plots of power-up transient response of trim bits versus replica bits for a supply voltage (VDD) ramp-up/down rate of 1V/ms.

FIG. 12 illustrates simulation results of the power-up transient response of two trim bits (one with a blown fuse, where $R_{FUSE}=10$ kΩ, and one with an unblown fuse, where $R_{FUSE}=200\Omega$) and two replica bits, which are skewed as described above. Referring to FIG. 12, in this simulation the power supply voltage (VDD) is linearly ramped up from 0 to 1V in 1 ms and then ramped back down from 1V to 0V in 1 ms (note that READ_EN is asserted for the duration of the simulation (i.e., the bits are not latched, and the circuit is not turned off when the replica bits are valid). It can be seen from FIG. 12, that for this particular embodiment, the replica bits, REP_0 represented by line 1202 and REP_1 represented by line 1204 require higher voltage on VDD to resolve than the normal trim bits, BIT_0 represented by line 1206 and BIT_1 represented by line 1208. Thus, the trim bits have been resolved and are valid and stable before a RESET signal 1210 is de-asserted by the logic circuit to indicate to the IC that the trim bits are valid and the boot process may commence. In this particular embodiment, REP_1 needs approximately 200 mV higher VDD and REP_0 needs approximately 250 mV higher VDD compared to the respective normal trim bits, BIT_1 and BIT_0.

Figure 13:
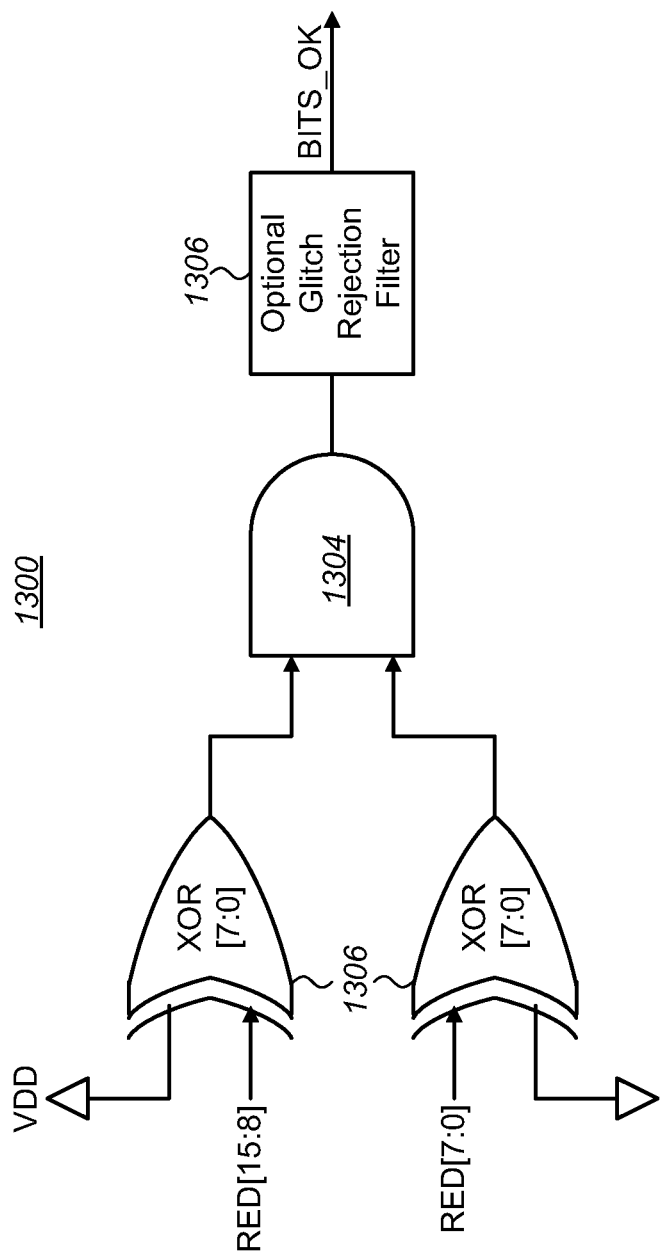
FIG. 13 is a block diagram of an embodiment of a redundancy bit check logic for generating a BITS_OK signal in an initial trim circuit.

The redundancy check logic 108 illustrated in FIG. 1 can be implemented in various ways. For example, in one embodiment, shown in FIG. 13, the redundancy check logic 1300 is implemented utilizing exclusive-or (XOR) gates 1302 and an AND gate 1304, where one input of each XOR gate is tied high or low, depending on a pre-determined 16-bit redundancy code or key. In the example circuit shown in FIG. 13, eight of the 16 redundant bits are programmed to logic one (fuses blown) and the other eight redundant bits are programmed to logic zero (fuses not blown). Each of the XOR symbols In FIG. 13 represents 8 instances, where 1 of 8 redundant bit outputs, RED[15:7], connects to 1 of 8 XOR instances, which have their other input tied to VDD, and 1 of 8 redundant bit outputs, RED[7:0], connects to 1 of 8 XOR instances, which have their other input tied to GND. The redundant bits can be distributed randomly throughout the memory array. When all redundant bits are valid a BITS_OK signal is asserted to the logic circuit 110 illustrated in FIG. 1.

As noted above, the redundancy check logic 1300 can further include an optional glitch rejection filter 1306 to suppress momentary transient glitches or noise on VDD, to avoid false triggering of a system reset. Alternatively, the glitch rejection filter may be implemented in the read/write control logic after the BITS_OK signal is combined with the skewed replica bits in the logic circuit 110, as shown in FIG. 1.

Additionally or alternatively a more elaborate and robust redundancy check logic, such as a cyclic redundancy check (CRC), may be used instead of the implementation shown in FIG. 13. A CRC is an error-detecting code commonly used in digital networks and storage devices to detect accidental changes to raw data. Blocks of data entering these systems get a short check value attached, based on the remainder of a polynomial division of their contents; on retrieval the calculation is repeated, and corrective action can be taken against presumed data corruption if the check values do not match (e.g., in the initial trim circuit described in the present invention, if the CRC logic detects invalid trim data, the control logic may initiate a re-read of the trim bits).

Figure 14:
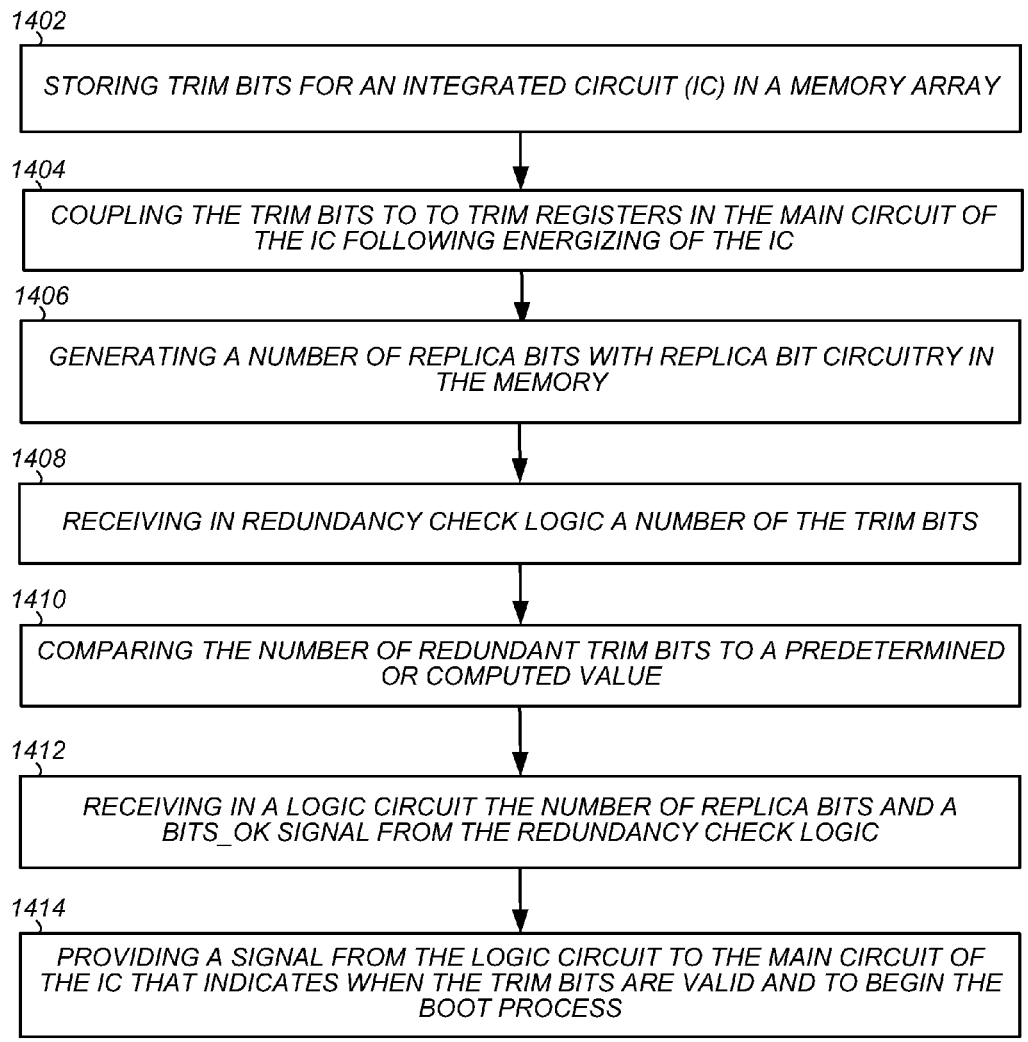
FIG. 14 is a flow chart of an embodiment of a method for operating an initial trim circuit using redundant and skewed replica bits.

FIG. 14 shows one embodiment of a process or method for operating an initial trim circuit using redundant and skewed replica bits to indicate when the trim bits are valid. Referring to FIG. 14, the method begins with storing trim bits for an integrated circuit (IC) in a memory array of a memory (1402). As noted above, these initial trim bits are determined and programmed only once during manufacturing, for example at wafer sort or following packaging of the IC. The trim bits are electrically coupled to trim registers in the main circuit of the IC following energizing of the IC (1404). Next, a number of replica bits are generated using replica bit circuitry in the memory (1406). Optionally, the process further includes receiving a number of the trim bits in redundancy check logic in the initial trim circuit (1408), and comparing the number of redundant trim bits to a predetermined or computed value or key (1410). The replica bits and a BITS_OK signal from the redundancy check logic are received in a logic circuit (1412). Finally, a signal from the logic circuit is provided to the main circuit of the IC that indicates when the trim bits are valid to begin the boot process (1414).

IMPLEMENTATIONS AND ALTERNATIVES

Although the initial trim bit circuit of the present disclosure including skewed replica bits and redundancy check logic has been described in detail with reference to embodiments including eFuse one-time-programmable (OTP) memory arrays, it will be evident that various modifications and changes may be made to these embodiments without departing from the broader spirit and scope of the disclosure.

In particular, the initial trim bit circuit may be changed to use other types of memory arrays and storage elements, such as metal (instead of poly) fuses, Zener diodes whose electrical properties change permanently when high current is passed through their P-N junction, anti-fuses, floating gate EEPROM or Flash devices, etc. These other storage elements may be used to create other types of trim bits and skewed one and zero replica bits, which are constructed in the same fashion as normal trim bits with only minor modifications to certain devices within the replica bit cell. These replica bits can be designed such that the minimum power supply voltage (VDD) required to resolve their predetermined state is slightly higher than the minimum VDD required to resolve the normal trim bits, in the same manner described above for the poly-fuse based memory array.

Figure 15:
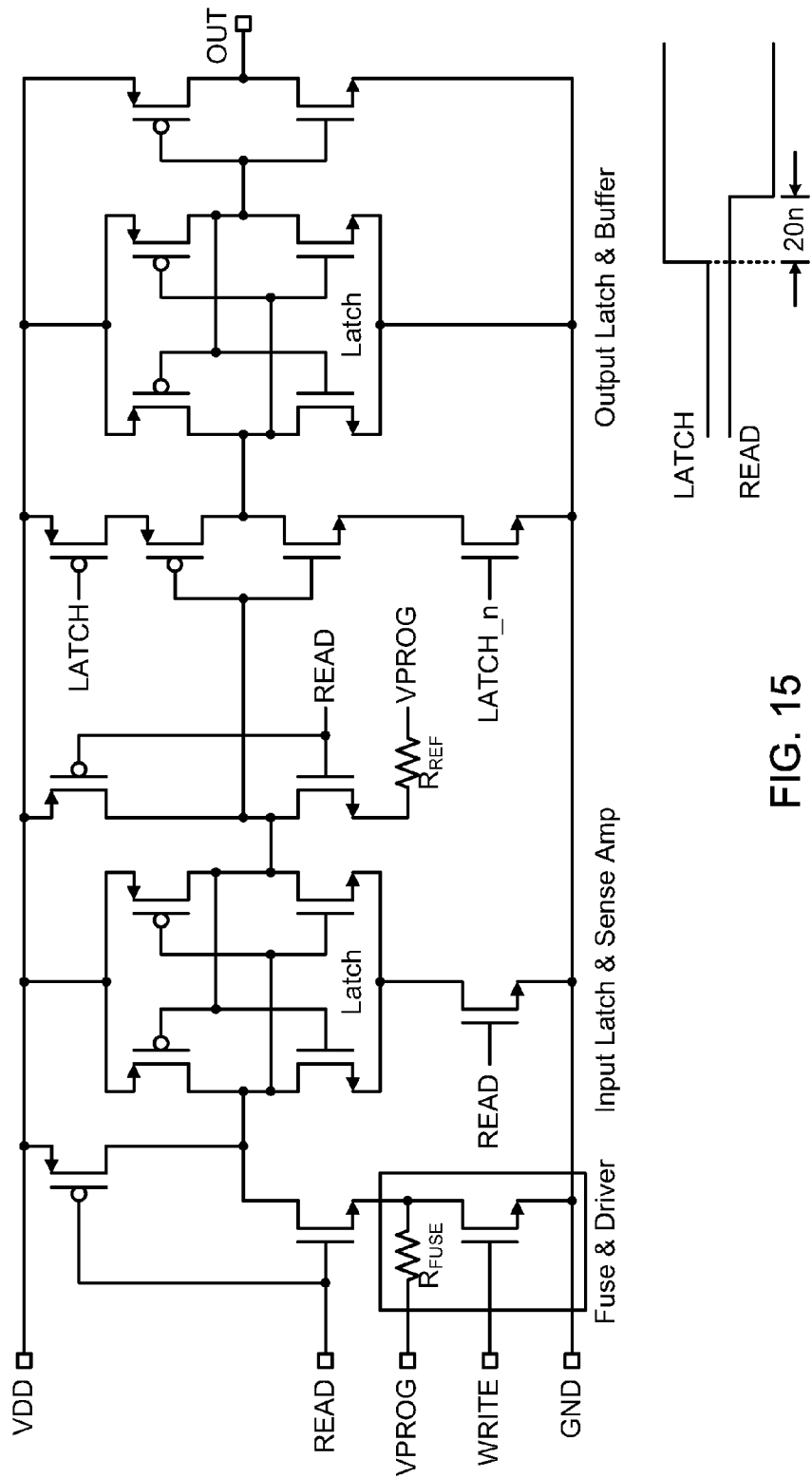
FIG. 15 is a schematic diagram illustrating another embodiment of a trim bit cell in a memory array that can be used in an initial trim bit circuit including redundancy check logic and skewed replica bits.

For example, the initial trim bit circuit 100 illustrated in FIG. 1 can be implemented utilizing a trim bit cell having a dual latch arrangement, such as that illustrated in FIG. 15, where the resolved state of the input latch depends on the resistance of a poly fuse, $R_{FUSE}$, as compared to a reference resistance, $R_{REF}$. Referring to FIG. 15, it is noted that each trim bit cell 1500 contains its own reference resistor, whereas in the previous embodiments the reference resistor resides in a read bias generator circuit, which is shared by all bits. FIG. 15 further includes a simplified timing diagram of READ and LATCH signals provided to the trim bit cell 1500 by read/write control logic in the OTP memory array. As shown in the timing diagram the read/write control logic in the OTP memory array delays the de-assertion of the READ signal with respect to the LATCH signal to ensure that the state of the fuse is latched before the sense amp bias is turned off. In one embodiment the delay is about 20 ns. As described in the previous embodiments, VPROG is driven high during factory test to blow fuses and coupled to ground during normal operation in the end application.

Initially, both sides of the input latch are driven to VDD (READ=0 and LATCH=0). A control circuit (not shown in FIG. 17) asserts READ and LATCH during the recall process. The input latch is set based on the difference between $R_{FUSE}$ and $R_{REF}$, where the output of the input latch is low for $R_{REF}<R_{FUSE}$ and high for $R_{REF}>R_{FUSE}$. The control circuit de-asserts READ and LATCH when the recall process completes, and the state of the eFuse is retained in the output latch.

This embodiment can use skewed replica bits to determine when the normal trim bits are valid. The replica bits may be skewed, such that they require a higher power supply voltage (VDD) to resolve than the normal bits, by increasing or decreasing $R_{REF}$ to achieve the desired results. For example, the fuse in the replica one bit may be replaced with a fixed value poly resistor, whose value is nominally equal to the minimum blown fuse resistance, which was 10 kΩ in the preferred embodiment example circuit. The reference resistor in the replica one bit may be decreased slightly, compared to the normal bit reference resistor, to achieve the desired result. Likewise, the reference resistor may be increased slightly in the replica zero bit, such that it requires slightly higher VDD to resolve, compared to the normal bits.

Thus, embodiments of an initial trim circuit and methods for operating the same to provide initial trim bits to an integrated circuit using redundancy and skewed replica bits have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment. The term to couple as used herein may include both to directly electrically connect two or more components or elements and to indirectly connect through one or more intervening components.

What is claimed is:

1. An initial trim circuit comprising:
a memory array including a plurality of trim bit cells to store and provide trim bits to trim registers in a main circuit of an integrated circuit (IC) including the initial trim circuit following energizing of the IC, the memory array comprising replica bit circuitry to generate a number of replica bits, wherein the replica bit circuitry is configured to generate the number of replica bits using a current through the replica bit circuitry skewed relative to a current through the plurality of trim bit cells; and
a logic circuit coupled to the memory array and the IC, the logic circuit configured to receive the number of replica bits and to provide a signal to the main circuit of the IC that indicates when the trim bits are valid.

2. The circuit of claim 1, wherein the number of replica bits include at least a replica zero bit and a replica one bit.

3. The circuit of claim 1, wherein the replica bit circuitry comprises a circuit similar to that of the plurality of trim bit cells.

4. The circuit of claim 1, wherein the current through the replica bit circuitry is skewed by 10% relative to the current through the plurality of trim bit cells.

5. The circuit of claim 1, wherein the replica bit circuitry is configured so that the number of replica bits resolve at a higher supply voltage than the trim bits.

6. The circuit of claim 1, wherein the logic circuit is further configured so that the signal to the IC also turns off the memory array.

7. The circuit of claim 1, further comprising redundancy check logic configured to receive a number of trim bits from the memory array, compare the number of trim bits received from the memory array to a predetermined value and to provide a BITS_OK signal to the logic circuit.

8. An initial trim circuit comprising:
a memory array including a plurality of trim bit cells to store and provide trim bits to trim registers in a main circuit of an integrated circuit (IC) including the initial trim circuit following energizing of the IC, the memory array further comprising replica bit circuitry to generate a number of replica bits, wherein the replica bit circuitry is configured to generate the number of replica bits using a current through the replica bit circuitry skewed relative to a current through the plurality of trim bit cells;
redundancy check logic configured to receive a number of trim bits from the memory array, compare the number of trim bits to a predetermined value and generate a BITS_OK signal; and
a logic circuit coupled to the memory array, redundancy check logic and the IC, the logic circuit configured to receive the number of replica bits, the BITS_OK signal, and to provide a signal to the main circuit of the IC that indicates when the trim bits are valid.

9. The circuit of claim 8, wherein the number of replica bits include at least a replica zero bit and a replica one bit.

10. The circuit of claim 8, wherein the replica bit circuitry comprises a circuit similar to that of the plurality of trim bit cells.

11. The circuit of claim 8, wherein the current through the replica bit circuitry is skewed by 10% relative to the current through the plurality of trim bit cells.

12. The circuit of claim 8, wherein the replica bit circuitry is configured so that the number of replica bits resolve at a higher supply voltage than the trim bits.

13. The circuit of claim 8, wherein the logic circuit is further configured so that the signal to the IC also turns off the memory array.

14. A method comprising:
storing trim bits for an integrated circuit (IC) in a memory array;
coupling the trim bits to trim registers in a main circuit of the IC following energizing of the IC;
generating a number of replica bits with replica bit circuitry in the memory array, wherein generating the number of replica bits comprises a current through the replica bit circuitry skewed relative to a current through trim bit cells in the memory array;
receiving the number of replica bits in a logic circuit coupled to the memory array and the IC; and
providing a signal to the main circuit of the IC that indicates when the trim bits are valid and to begin a boot process.

15. The method of claim 14, wherein the replica bit circuitry is configured so that generating the number of replica bits comprises providing the replica bit circuitry a higher supply voltage than that needed to resolve the trim bits provided to the main circuit of the IC.

16. The method of claim 14, wherein providing the signal to the main circuit of the IC further comprises providing a signal to the memory array to turn off the memory array.

17. The method of claim 14, further comprising:
receiving in redundancy check logic a number of trim bits;
comparing the number of trim bits to a predetermined value; and
providing a BITS_OK signal to the logic circuit.

* * * * *